(12) United States Patent
Tanabe

(10) Patent No.: US 8,138,867 B2
(45) Date of Patent: Mar. 20, 2012

(54) SUPERCONDUCTING MAGNET DEVICE

(75) Inventor: Hajime Tanabe, Tokyo (JP)

(73) Assignee: Mitsubishi Electric Corporation, Chiyoda-Ku, Tokyo (JP)

(*) Notice: Subject to any disclaimer, the term of this patent is extended or adjusted under 35 U.S.C. 154(b) by 126 days.

(21) Appl. No.: 12/574,937

(22) Filed: Oct. 7, 2009

(65) Prior Publication Data
US 2010/0301977 A1 Dec. 2, 2010

(30) Foreign Application Priority Data
Jun. 1, 2009 (JP) .................. 2009-132102

(51) Int. Cl.
*H01F 1/00* (2006.01)
(52) U.S. Cl. .................. 335/216; 324/318
(58) Field of Classification Search .......... 335/216, 335/296–299; 324/318, 319
See application file for complete search history.

(56) References Cited

U.S. PATENT DOCUMENTS

| | | | | |
|---|---|---|---|---|
| 4,535,291 A * | 8/1985 | Lee et al. | ...... | 335/216 |
| 4,689,707 A * | 8/1987 | Schwall | ...... | 335/216 |
| 4,812,797 A * | 3/1989 | Jayakumar | ...... | 335/299 |
| 5,329,266 A | 7/1994 | Soeldner et al. | | |
| 6,822,451 B2 * | 11/2004 | Hollis | ...... | 324/319 |
| 6,977,571 B1 * | 12/2005 | Hollis et al. | ...... | 335/216 |
| 7,474,515 B2 * | 1/2009 | Mallett | ...... | 361/19 |
| 2010/0277263 A1 * | 11/2010 | Schnur | ...... | 335/216 |

FOREIGN PATENT DOCUMENTS

JP 4-287903 A 10/1992

* cited by examiner

*Primary Examiner* — Bernard Rojas
(74) *Attorney, Agent, or Firm* — Buchanan Ingersoll & Rooney PC

(57) ABSTRACT

A superconducting magnet device includes a main coil that generates a static magnetic field in an imaging space and a disturbance magnetic field compensation coil that suppresses influences of a variable magnetic field flowing inside from outside in the imaging space. The main coil is divided to at least two diode circuits. The disturbance magnetic field compensation coil has at least one coil formed of minus turns so that mutual inductances with the respective diode circuits in the main coil are made minimum.

5 Claims, 9 Drawing Sheets

SUPERCONDUCTING MAGNET DEVICE

BACKGROUND OF THE INVENTION

1. Field of the Invention

The present invention relates to a superconducting magnet device having a coil (hereinafter, referred to as a disturbance magnetic field compensation coil) that compensates for a disturbance magnetic field having adverse influences on imaging by means of MRI in a medical tomographic imaging apparatus (hereinafter, referred to as an MRI apparatus) employing a magnetic resonance phenomenon occurring in a static magnetic field source (hereinafter, referred to as a main coil) that generates a static magnetic field using a superconducting coil.

2. Background Art

Generally, magnets generating a static magnetic field needed for an MRI apparatus include a permanent magnet, a normal conducting magnet, a superconducting magnet, and so forth, and a superconducting magnet is currently the mainstream owing to the size of a static magnetic field and temporal stability. In the static magnetic field source using the superconducting magnet, the generated magnetic field is so strong that chiefly two methods are adopted to prevent leakage of the magnetic field to the outside. Magnets are largely classified into two types according to the methods. One type is used in a method (passive shielding method) of covering the magnet main body with an iron body and the other type is used in a method (active shielding method) of disposing a superconducting coil of the reverse polarity instead of the iron body. Of these two types, the mainstream is the magnet used in the active shielding method because of lightness and compactness of the main body.

Meanwhile, the MRI apparatus is installed in various places and environments. The MRI apparatus may be installed in a place neighboring a road in one case and it may be installed in a place in close proximity to a power cable for an electric train or for power transmission in another case. In such cases, a variable magnetic field (hereinafter, referred to as the disturbance magnetic field) of a non-negligible size is flowing into an imaging space from outside during imaging by means of MRI because of a large iron body that is approaching or influences of an alternating magnetic field. In the case of the superconducting magnet used in the passive shielding method, the disturbance magnetic field seldom raises a problem because the iron body has the self-shielding effect. However, in the case of the superconducting magnet used in the active shielding method, the disturbance magnetic field flows into the imaging space almost intact unless some measure is taken and is therefore highly likely to have significant adverse influences on imaging by means of MRI.

In order to suppress (compensate for) the influences of the disturbance magnetic field, a superconducting coil exclusively used to compensate for a disturbance magnetic field (disturbance magnetic field compensation coil) is disposed besides the main coil for the following reason. That is, because a current is induced into the disturbance magnetic field compensation coil in a case where a disturbance magnetic field flows inside and a compensation magnetic field is generated, by cancelling out the disturbance magnetic field with the compensation by the disturbance magnetic field compensation coil and the compensation by the main coil (albeit relatively minimal), it becomes possible to suppress a variation of the magnetic field in the imaging space to several % or less of a quantity of the disturbance magnetic field that has flown inside.

The main coil is a superconducting coil and a large current normally flows in a permanent current mode. However, should a superconducting state be broken (hereinafter, referred to as quench) for some reason, it releases large energy at a time. Although most of the energy is released in the form of heat, in a case where the main coil and the disturbance magnetic field compensation coil are magnetically coupled to each other, the energy is released to the disturbance magnetic field compensation coil in the form of electromagnetic induction.

In this instance, although it depends on the degree of magnetic coupling, a relatively large current is induced into the disturbance magnetic field compensation coil and the magnetic field generated by the main coil has not attenuated sufficiently in most cases. Consequently, an extremely large electromagnetic force is applied to the disturbance magnetic field compensation coil itself. This is attributed to the fact that the disturbance magnetic field compensation coil has fewer turns than the main coil for the reasons of the cost and the installation space and a current as large as or larger than the current (for example, 400 to 700 A) in the main coil is induced into the disturbance magnetic field compensation coil in some cases. Nevertheless, because the disturbance magnetic field compensation coil has fewer turns and hence a smaller volume, it is difficult to provide the disturbance magnetic field compensation coil with sufficient strength.

It is therefore necessary to take a measure not to induce a large current into the disturbance magnetic field compensation coil as less frequently as possible, for example, by inhibiting a current of several tens Amperes or more from flowing. However, because the disturbance magnetic field compensation coil is normally formed of a superconducting coil, a current of several tens Amperes readily flows even when a considerably poor superconducting wire material is used. Herein, an iron body that has approached the disturbance magnetic field may possibly halt and in a case where the disturbance magnetic field compensation coil is formed of a copper wire or the like, an induced current will be attenuated shortly, which makes compensation over a long period impossible. This is the reason why the disturbance magnetic field compensation coil is formed of a superconducting coil. That is to say, the disturbance magnetic field compensation coil is formed by taking such an attenuation time constant into account.

It thus becomes crucial to reduce the magnetic coupling between the main coil and the disturbance magnetic coil compensation coil as small as possible preferably in the design stage. Because high homogeneity of the static magnetic field is required for an MRI superconducting magnet, the main coil is often formed by connecting a plurality of coils in series. In reference to this configuration, the disturbance magnetic field compensation coil is formed of the same number of coils, which are also generally connected in series. It should be noted that the main coil and the disturbance magnetic field compensation coil form individual closed circuits that are independent from each other.

The magnetic coupling between the main coil and the disturbance magnetic field compensation coil may be reduced by spacing apart these coils. However, for the reasons of space and structural members, the magnetic coupling is reduced basically by superposing the respective disturbance magnetic field compensation coils on the corresponding main coils while being electrically insulated from each other and by appropriately selecting the numbers of turns (turn number ratio) of the main coils and the disturbance magnetic field compensation coils (see Japanese Patent No. 3043478).

An example is set forth in Table 1 below. In this example, each of the main coil and the disturbance magnetic field compensation coil has six pairs of coils and all the disturbance magnetic field compensation coils are superposed on the corresponding main coils (detailed positions and dimensions are omitted).

TABLE 1

Example of the numbers of turns of the main coil and the disturbance magnetic field compensation coil in the related art

| | No. 1 | No. 2 | No. 3 | No. 4 | No. 5 | No. 6 |
|---|---|---|---|---|---|---|
| Main coil | 247 | 546 | 969 | −420 | 2700 | −1376 |
| Disturbance magnetic field compensation coil | 25 | 80 | 80 | 50 | 90 | 515 |

("−" indicates turns in the reversed direction and the disturbance magnetic field compensation coil has a total of 840 × 2 turns)

In this instance, a variation of the magnetic field in the imaging space is found to be about 4.2% of a quantity of the disturbance magnetic field that has flown inside when logically computed from the relative turn number ratios of the disturbance magnetic field compensation coils No. 1 through No. 6 and therefore satisfies a general target value, that is, 5% or less.

The self-inductances and the mutual inductance of the main coil and the disturbance magnetic field compensation coil in this instance are as follows:

Self-inductance of the main coil: 37.790 H (henries)

Self-inductance of the disturbance magnetic field compensation coil: 3.095 H (henries)

Mutual inductance of the both coils: 0.014 H (henry)

A change of current flowing in each coil after the quench of the main coil is shown in FIG. 7. As has been described, because the mutual inductance of the both coils is extremely small, for example, in a case where the main coil in which a current of 500 A has been flowing in a steady state is quenched and the current is reduced to 0 A, only a current of about 2.3 A is induced into the disturbance magnetic field compensation coil without having to take consumption by heat into account. Accordingly, a problem resulting from the electromagnetic force generated by the induced current as described above hardily occurs.

The main configuration of a superconducting magnet in the related art will be described with reference to FIG. 8. Referring to the drawing, the superconducting magnet 100 is formed of a main coil 200 that generates a static magnetic field in the imaging space of an MRI apparatus and a disturbance magnetic field compensation coil 310 that suppresses (compensates for) influences of a disturbance magnetic field flowing into the imaging space, and each coil is formed of a superconducting coil. The main coil 200 and the disturbance magnetic field compensation coil 310 form individual closed loop circuits that are electrically independent from each other. Basically, respective coils forming the disturbance magnetic field compensation coil 310 are disposed on the corresponding coils forming the main coil 200. In the drawing, signs, "+" and "−", in the respective coils forming the main coil 200 and the disturbance magnetic field compensation coil 310 indicate the winding directions of the respective coils.

The main coil 200 is divided to two circuits with the use of diodes 221: one is a coil group 210 (coils 201a, 201b, 202a, 202b, 203a, 203b, 204a, and 204b) having relatively small energy and the other is a coil group 211 (coils 205a, 205b, 206a, and 206b) having relatively large energy. Owing to this configuration, a risk of consuming large energy by a coil having a small volume (heat capacity) is lowered and protection against generated voltage and energy consumption (heat generation in the coil) at the time of quench is provided.

However, regardless of which coil is quenched, a noticeable difference of currents is unavoidably generated between the two diode circuits. This difference of currents varies with a coil that is quenched, a quench back method, and so forth. An example of an image of currents in the both coils after the quench of the main coil is shown in FIG. 9. In this example, coils No. 1 through No. 4 in Table 1 above are given as a coil group having small energy and coils No. 5 and No. 6 are given as a coil group having large energy. In this case, as is obvious from the drawing that a difference of currents between the group having large energy and the group having small energy is as large as about 300 A at the maximum. Accordingly, a large current is also induced transiently into the disturbance magnetic field compensation coil, which possibly reaches as large as about 200 A at the maximum.

In other words, it is understood that no matter how small the magnetic coupling (mutual inductance) between the main coil and the disturbance magnetic field compensation coil is made, a large current is induced temporarily into the disturbance magnetic field compensation coil at the time of quench when the magnetic coupling (mutual inductances) between each of the coil group having small energy and the coil group having large energy in the main coil and the disturbance magnetic field compensation coil is large. In this example, the mutual inductances between the respective coil groups in the main coil and the disturbance magnetic field compensation coil are as follows:

Mutual inductance between the group having small energy in the main coil and the disturbance magnetic field compensation coil: 2.206 H (henries)

Mutual inductance between the group having large energy in the main coil and the disturbance magnetic field compensation coil: −2.192 H (henries)

Mutual inductance between the main coil (whole) and the disturbance magnetic field compensation coil: 0.014 H (henry)

It is understood from this result that the mutual inductances between the respective groups in the main coil and the disturbance magnetic field compensation coil are about 160 times larger than the mutual inductance between the main coil and the disturbance magnetic field compensation coil. Accordingly, a current of about 200 A at the maximum is induced into the disturbance magnetic field compensation coil.

In this instance, a large electromagnetic force is generated in the disturbance magnetic field compensation coil and a concrete example is set forth in Table 2 below.

TABLE 2

Maximum electromagnetic force applied to the disturbance magnetic field compensation coil in example of quench in the related art

| (Unit: ton) | No. 1 | No. 2 | No. 3 | No. 4 | No. 5 | No. 6 |
|---|---|---|---|---|---|---|
| Electromagnetic force in Z direction | −0.22 | 0.49 | 1.83 | 3.51 | 0.30 | 5.10 |
| Electromagnetic force in R direction | −0.70 | −2.17 | −3.62 | 2.68 | −20.70 | 80.18 |

It is understood from Table 2 above that an electromagnetic force in the R direction of the coil No. 6 is particularly large. In many cases, a space on the periphery of the coil No. 6 is tight for the reason of installation and it is therefore difficult to take a measure against the electromagnetic force in the R direction. Hence, the most urgent and crucial issue is to reduce this electromagnetic force. From Table 1 above, the disturbance magnetic field compensation coil No. 6 has 515 turns and it is another issue to reduce the number of turns for the reason of space. However, in the design of a normal disturbance magnetic field compensation coil, when the magnetic coupling with the main coil is reduced, the number of turns of the coil No. 6 has to take a relatively large value. It is therefore difficult to reduce the number of turns.

Meanwhile, in view of the foregoing, it is desirable to reduce the magnetic coupling (mutual inductances) between each of the coil group having small energy and the coil group having large energy in the main coil and the disturbance magnetic field compensation coil. It is, however, desirable to reduce the mutual conductance of the main coil (whole) and the disturbance magnetic field compensation coil at the same time. The reason why is as follows. That is, it is necessary for the disturbance magnetic field compensation coil to take into account not only a current induced when the main coil is quenched but also a current induced in a case where the main coil is magnetized or demagnetized or in a case where a superconducting portion in a persistent current switch (PCS) 220 (see FIG. 8) provided inside the superconducting magnet is quenched, and in such a case, the induced current is determined by the mutual inductance of the main coil (whole) and the disturbance magnetic field compensation coil.

As has been described, in a superconducting magnet device provided with a disturbance magnetic field compensation coil to suppress a variable magnetic field flowing into the MRI apparatus from outside, for example, even when the mutual inductance between the whole main coil and the disturbance magnetic field compensation coil is minimized in order to minimize an induced current generated when the main coil is quenched, there is a difference of currents between the respective diode circuits at the time of quench in a case where the main coil has a plurality of protection diode circuits. The superconducting magnet device therefore has a problem that a large induced current is generated by the mutual inductances between the respective diode circuits and the disturbance magnetic field compensation coil.

SUMMARY OF THE INVENTION

An object of the invention is to solve the problems discussed above by protecting the disturbance magnetic field compensation coil as safely as possible so that an inconvenience hardly occurs when the main coil is quenched.

A superconducting magnet device according to one aspect of invention includes a main coil that generates a static magnetic field in an imaging space and a disturbance magnetic field compensation coil that suppresses (compensates for) influences of a variable magnetic field flowing inside from outside in the imaging space. The main coil is divided to at least two diode circuits and the disturbance magnetic field compensation coil has at least one coil formed of minus turns so that mutual inductances with the respective diode circuits in the main coil are made minimum.

According to one aspect of the invention, not only is it possible to reduce the magnetic coupling between the whole main coil and the disturbance magnetic field compensation coil, but it is also possible to reduce the magnetic coupling between the respective diode circuits in the main coil and the disturbance magnetic field compensation coil. Hence, even in a case where a difference of currents is generated between the respective diodes when the main coil is quenched, a current induced into the disturbance magnetic field compensation coil is suppressed and so is an electromagnetic force generated in association with the induced current. Consequently, an inconvenience, in particular, a mechanical inconvenience to the disturbance magnetic field compensation coil hardly occurs.

In addition, because a current induced into the disturbance magnetic field compensation coil is reduced, it is possible to reduce the possibility that the disturbance magnetic field compensation coil itself is quenched. Thermal and electrical processes involved with the quench can be thus reduced.

The foregoing and other object, features, aspects, and advantages of the present invention will become more apparent from the following detailed description of the present invention when taken in conjunction with the accompanying drawings.

DESCRIPTION OF THE PREFERRED EMBODIMENTS

First Embodiment

Figure 1:
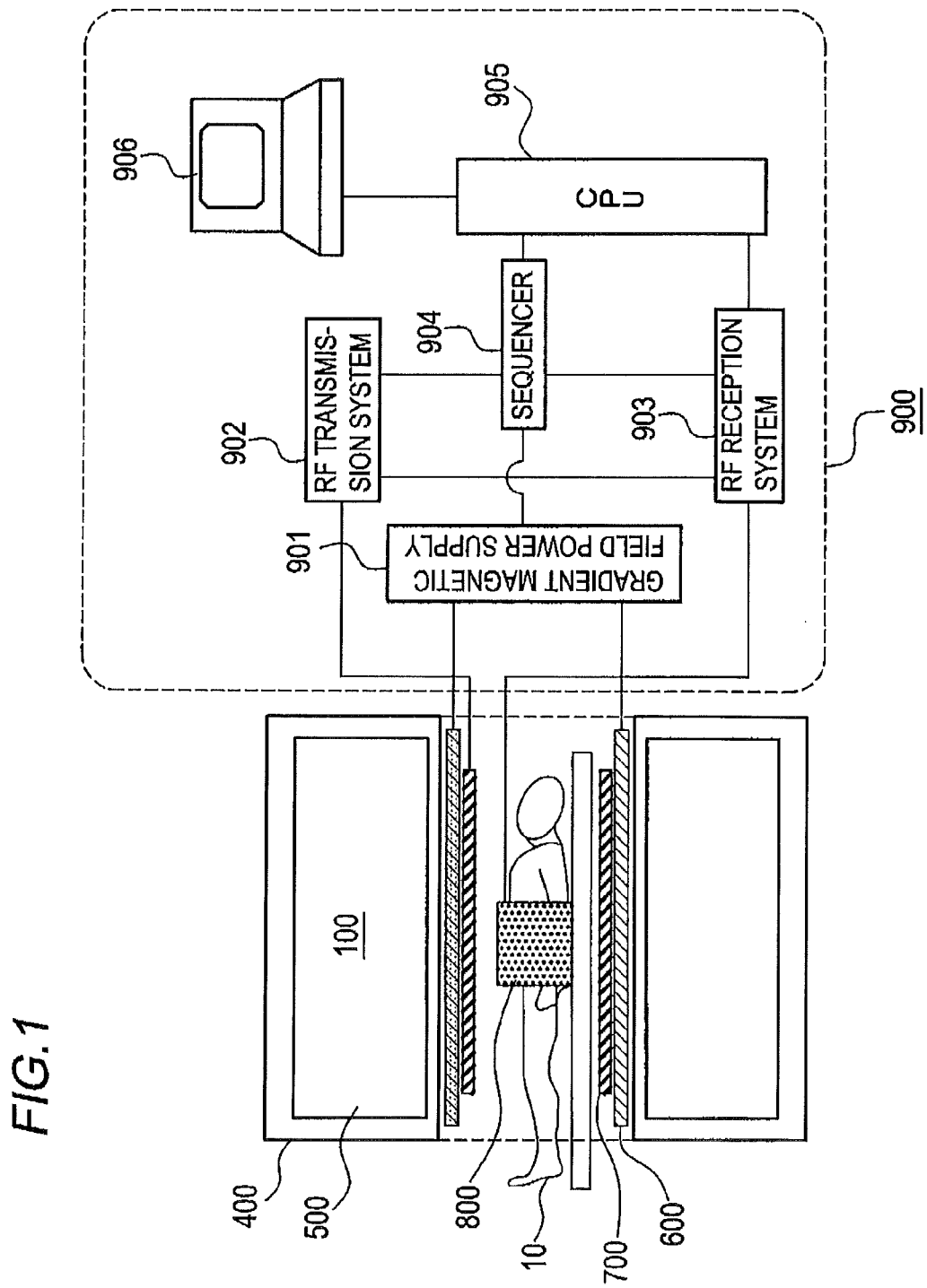
FIG. 1 is a schematic diagram showing the configuration of an MRI apparatus employing a superconducting magnet of the invention.

Hereinafter, embodiments of the invention will be described in detail with reference to the drawings. FIG. 1 is a schematic diagram showing the configuration of an MRI apparatus employing a superconducting magnet of the invention. A superconducting magnet 100 is accommodated in a cooling container 500 inside a vacuum insulting container 400. Generally, a gradient magnetic field coil 600, an RF transmission coil 700, and an RF reception coil 800 are disposed around a patient (subject) 10 inserted in an imaging space within a static magnetic field generated by the superconducting magnet 100, and these coils are controlled by a control device 900. The control device 900 is formed, for example, of a gradient magnetic field power supply 901, an RF transmission system 902, an RF reception system 903, a sequencer 904, a CPU 905, and a console 906, such as a monitor and a keyboard.

Figure 2:
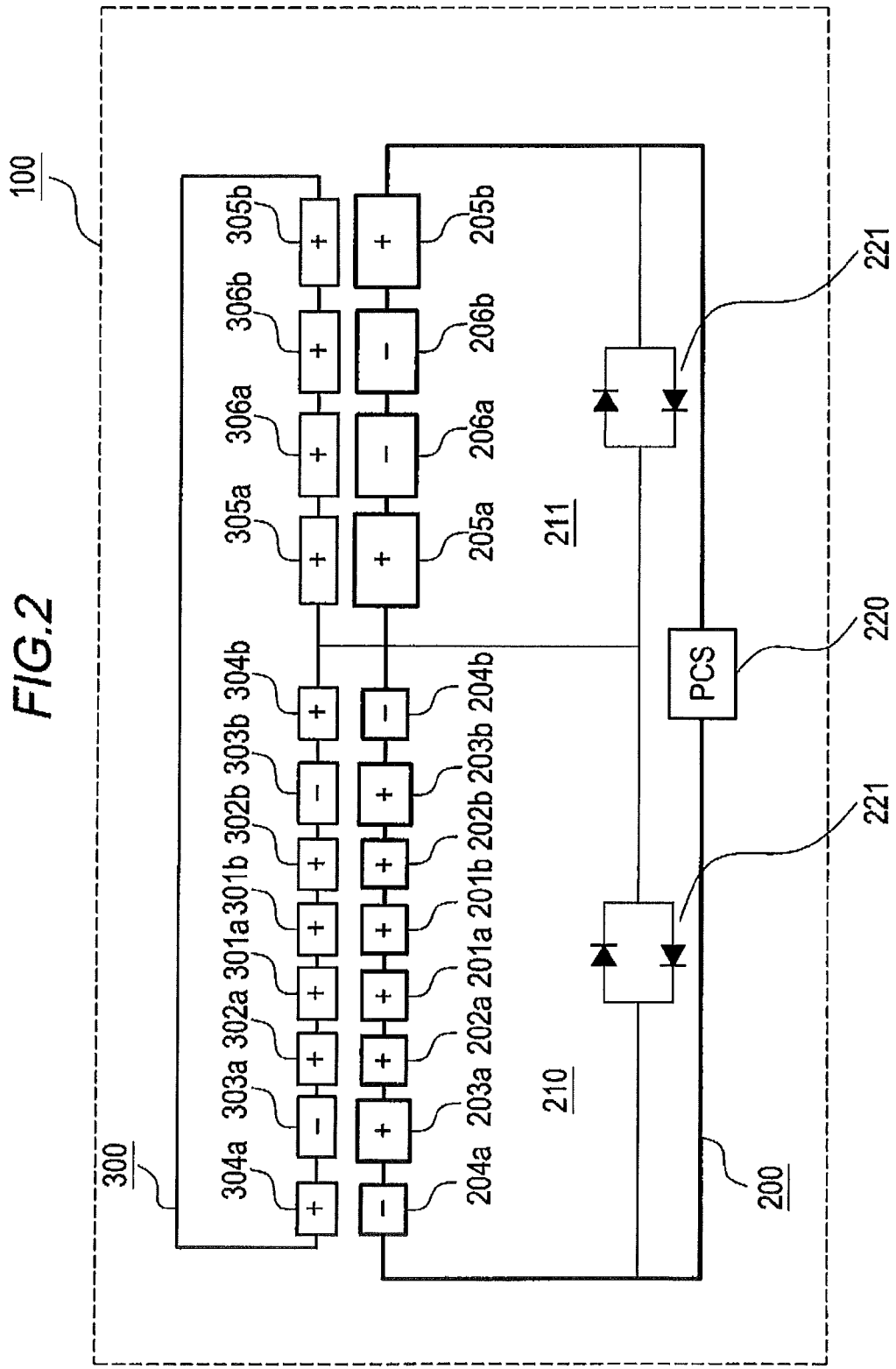
FIG. 2 is a schematic circuit diagram showing the configuration of a superconducting magnet according to a first embodiment of the invention.

FIG. 2 is a schematic circuit diagram showing the configuration of the superconducting magnet 100 employed in the MRI apparatus configured as above. The superconducting magnet 100 is formed of a main coil 200 that generates a static magnetic field in the imaging space of the MRI apparatus and a disturbance magnetic field compensation coil 300 that suppresses (compensates for) influences of a disturbance magnetic field flowing into the imaging space. The respective circuits are electrically independent from each other. The main coil 200 is a superconducting coil and forms one closed loop. The main coil 200 is normally dipped in a refrigerant, such as liquid helium, in the cooling container 500 and is in a superconducting state so as to generate a strong and stable static magnetic field in the imaging space of the MRI apparatus. A persistent current switch (PCS) 220 is disposed in the superconducting loop of the main coil 200 and plays a role of entrapping a current within the main coil 200 by separating an unillustrated external static magnetic field power supply after a magnetic field is generated by the main coil 200 using this static magnetic field power supply.

The main coil 200 sometimes becomes a so-called quench state where it undergoes transition from a superconducting state to a normal conducting state due to internal heat generation caused by a microcrack. The main coil 200 then generates a voltage abruptly by resistance generated by the quench and generates heat by energy consumption within the coil. In order to prevent such inconveniences occurring inside the main coil 200, protection is provided with the use of diodes 221. Each diode 221 is disposed with a set of both directions so that it operates in either direction. In FIG. 2, one diode 221 is disposed in each circuit and each direction for ease of description. However, the number of the diode 221 is not limited to one and a plurality of diodes 221 may be disposed in series according to a voltage to be controlled by the diodes.

Further, in this embodiment, the main coil 200 is divided to two circuits by the diodes 221: one is a coil group 210 having relatively small energy and the other is a coil group 211 having relatively large energy. This configuration lowers a risk of consuming large energy by a coil having a small volume (heat capacity). The coil group 210 having relatively small energy is formed of a total of eight coils 201a, 201b, 202a, 202b, 203a, 203b, 204a, and 204b and the coil group 211 having relatively large energy is formed of a total of four coils 205a, 205b, 206a, and 206b. Coils labeled with the same reference numeral suffixed with small letters "a" and "b" are disposed symmetrically with respect to the axial direction of the main coil 200 and form a pair as a static magnetic field output.

Meanwhile, the disturbance magnetic field compensation coil 300 is also a superconducting coil and forms one closed loop. As with the main coil 200, the disturbance magnetic field compensation coil 300 is also formed of a total of 12 superconducting coils 301a, 301b, 302a, 302b, 303a, 303b, 304a, 304b, 305a, 305b, 306a, and 306b, which are basically disposed on the corresponding coils forming the main coil 200. It should be noted, however, that these coils are disposed on the corresponding coils forming the main coil 200 in terms of the structure and they are electrically isolated from each other. Herein, the disturbance magnetic field compensation coil 300 is disposed on the main coil 200 in order to make the structure of the superconducting magnet 100 as simple as possible and the disturbance magnetic field compensation coil 300 is not necessarily disposed on the main coil 200. Also, although it is not shown in the drawing, as with the main coil 200, there is a case where a persistent current switch and protection diodes are provided to the disturbance magnetic field compensation coil 300.

As has been described, a current is automatically induced into the disturbance magnetic field compensation coil 300 in response to a disturbance magnetic field flowing into the superconducting magnet from outside and the disturbance magnetic field coil 300 compensates for the influences in the imaging space. On the other hand, in terms of the homogeneity of the magnetic field in the imaging space, when a current is induced into the disturbance magnetic field compensation coil 300, the resulting error magnetic field possibly deteriorates the homogeneity of the magnetic field in the imaging space. From a normally assumable quantity of the disturbance magnetic field, an induced current is extremely small. However, there is a possibility that the induced current is accumulated to the extent that it has non-negligible adverse influences while the superconducting magnet is kept used over a long period.

Generally, no current is flowing in the disturbance magnetic field compensation coil 300 in an initial state and a current sufficient to compensate for a variable magnetic field is induced only when the variable magnetic field is flows inside from outside. This current is generally designed to be a fine current of 1 A or less even when a variable magnetic field flows inside. Herein, influences of the disturbance magnetic field compensation coil on the homogeneity of the magnetic field in the imaging space are not taken into account from the viewpoint of design. Moreover, a current flowing in the disturbance magnetic field compensation coil can be a cause to disturb the homogeneity of the magnetic field in no small measure. It is therefore preferable to set the current in the initial state to 0. Accordingly, although it is not shown in the drawing, the current in the initial state is reduced to 0 by providing a heater having resistance sufficient to reduce the current to 0 somewhere in the loop of the disturbance magnetic field compensation coil to have thermal contact alone. Further, a current induced into the disturbance magnetic field compensation coil may possibly be increased as it is superimposed while the MRI apparatus is operated continuously. To avoid such an inconvenience, a method of reducing the current to 0 by periodically energizing the heater is adopted in some cases.

Ideally, it is desirable to achieve the disturbance magnetic field compensation coil designed most suitably not to have influences on the homogeneity of the magnetic field in the imaging space. However, under present circumstances, it is extremely difficult to achieve a high-level most suitable design.

Incidentally, the disturbance magnetic field compensation coils in the related are all formed of plus turns. However, when a part of the coils are formed of minus turns, an error magnetic field, in principle, can also generate the cancelling effect by the plus turns and the minus turns. Accordingly, there is a possibility that an error magnetic field being generated is cancelled in a satisfactory manner.

The disturbance magnetic field compensation coil 300 of the first embodiment is therefore configured in such a manner that disturbance magnetic field compensation coils formed of minus turns are disposed so that the magnetic coupling with the main coils is reduced and an error magnetic field only within a range that does not have adverse influences on the imaging space is generated in achieving comprehensible optimization.

Referring to FIG. 1, signs, "+" and "−", in the respective coils forming the main coil 200 and the disturbance magnetic field compensation coil 300 indicate the winding directions of the respective coils. The sign, "+", indicates a coil (coil formed of plus turns) wound around in the forward direction and this coil generates a magnetic field in a positive direction (the same direction as the static magnetic field) in the imaging space when a current flows therein. Whereas the sign, "−", indicates a coil (coil formed of minus turns) wound around in the reverse direction and this coil generates a magnetic field in a negative direction (the direction opposite to the static magnetic field) in the imaging space.

Figure 8:
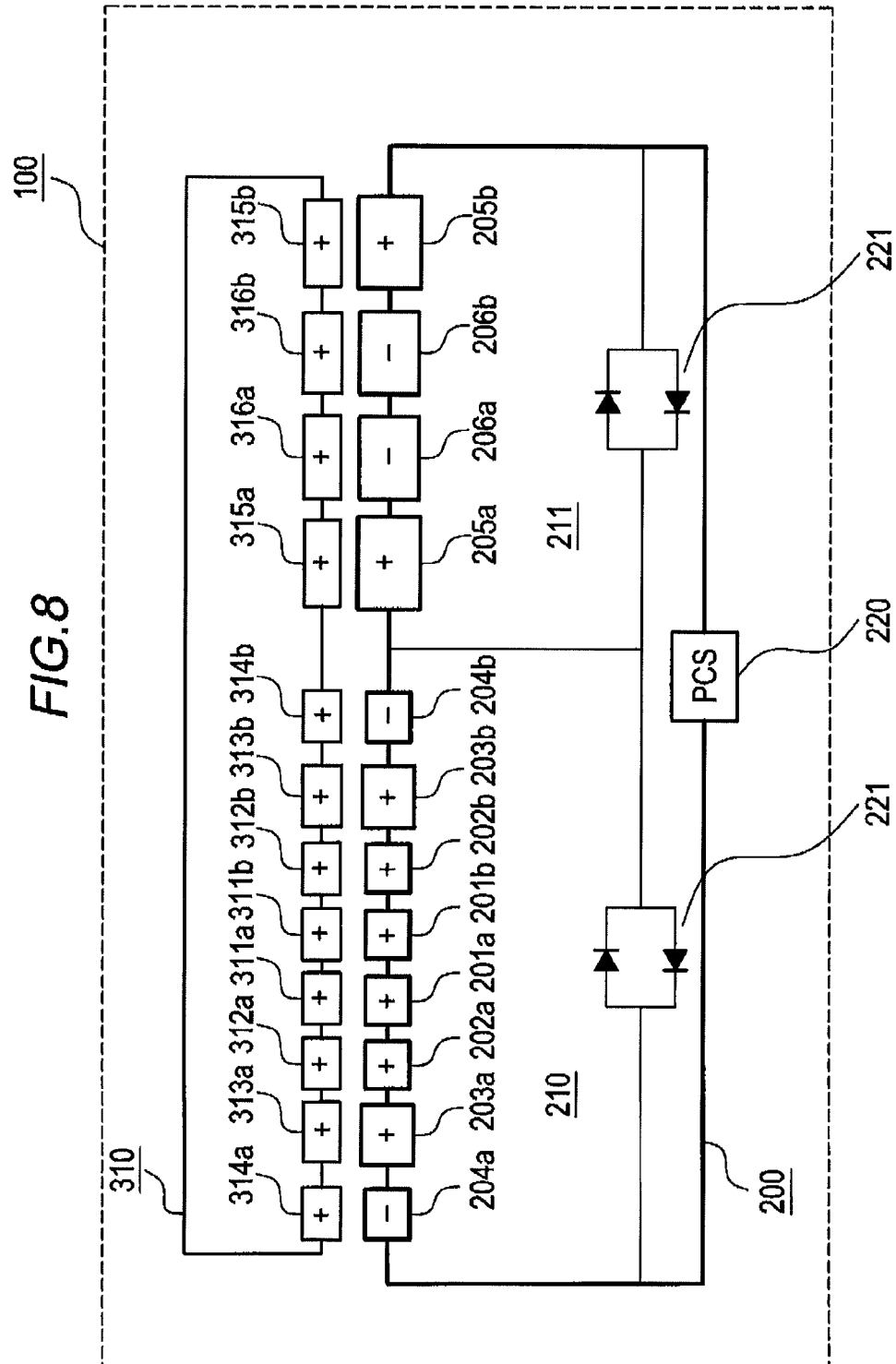
FIG. 8 is a schematic circuit diagram showing the configuration of a superconducting magnet in the related art.

The disturbance magnetic field compensation coil 300 of the first embodiment is different from the disturbance magnetic field compensation coil 310 in the related art of FIG. 8 in that the coils 303a and 303b are coils formed of minus turns and disposed, respectively, on the main coils 203a and 203b that are coils formed of plus turns. An example of the winding directions and the numbers of turns of the main coil 200 and the disturbance magnetic field compensation coil 300 of this embodiment are set forth in Table 3 below. As has been described, each of the main coil 200 and the disturbance magnetic field compensation coil 300 has a total of 12 coils (six pairs of coils symmetrical with respect to the axial direction) and each is indicated in Table 3 as six pairs of No. 1 through No. 6.

In Table 3 below, pairs No. 1 through No. 6 of the main coils correspond to coils 201(a and b), 202(a and b), 203(a and b), 204(a and b), 205(a and b), and 206(a and b), respectively, and pairs No. 1 through No. 6 of the disturbance magnetic field compensation coils correspond to 301(a and b), 302(a and b), 303(a and b), 304(a and b), 305(a and b), and 306(a and b), respectively. Also, the sign, "−", in the table indicates a coil formed of minus turns.

TABLE 3

Example of the numbers of turns of the main coil and the disturbance magnetic field compensation coil of the first embodiment of the invention

|  | No. 1 | No. 2 | No. 3 | No. 4 | No. 5 | No. 6 |
|---|---|---|---|---|---|---|
| Main coil | 247 | 546 | 969 | −420 | 2700 | −1376 |
| Disturbance magnetic field compensation coil | 26 | 143 | −155 | 90 | 104 | 322 |

("−" indicates turns in reversed direction and disturbance magnetic field compensation coil has a total of 840 × 2 turns)

Meanwhile, in the related art, as are set forth in Table 1 above and shown in FIG. 8, the disturbance magnetic field compensation coil 310 has no coils formed of minus turns. In order to make a difference of techniques of the invention and the related art obvious by comparison, the main coils of Table 1 and Table 3 are totally identical and a total number of turns of the disturbance magnetic field compensation coils are equal.

In this instance, a variation of the magnetic field in the imaging space with respect to a variable magnetic field flowing inside from outside is found to be about 4.45% when logically calculated from the relative turn number ratios of the disturbance magnetic field compensation coils No. 1 through No. 6. As with the example of the technique in the related art set forth in Table 1 above, the result satisfies a typical target value of 5% or less. Also, the self-inductances and the mutual inductance of the main coil 200 and the disturbance magnetic field compensation coil 300 are as follows:

Self-inductance of the main coil: 37.790 H (henries)
Self-inductance of the disturbance magnetic field compensation coil: 1.371 H (henries)
Mutual inductance of the both coils: −0.015 H (henry)

As has been described, as with the example of the technique in the related art, the mutual inductance of the both coils is extremely small. Accordingly, in a case where the current of 500 A flowing in a steady state is reduced to 0 A when the main coil 200 is quenched, a current to be induced into the disturbance magnetic field compensation coil 300 is calculated to be as small as about 5.5 A. It should be appreciated, however, that this is a case where the current in the main coil 200 is reduced uniformly and energy consumption by heat is not taken into account.

An operation of the superconducting magnet device of the first embodiment will now be described.

As has been described, in order to protect the coils at the time of quench, the main coil 200 of the invention has two diodes circuits: the coil group 210 having relatively small energy and the coil group 211 having relatively large energy. In a case where any of the coils forming the main coil 200 is quenched for some reason, resistance is generated in the quenched coil and a current in the main coil 200 starts to attenuate while energy within the main coil 200 is consumed by heat generation. At the same time, energy is dispersed by the mutual inductance with the other coils and various voltages are generated at the respective points. In a case where the diodes 221 are activated (turned ON) by such voltages, the current further attenuates while a difference is being generated between the currents in the coil groups 210 and 211.

Figure 6:
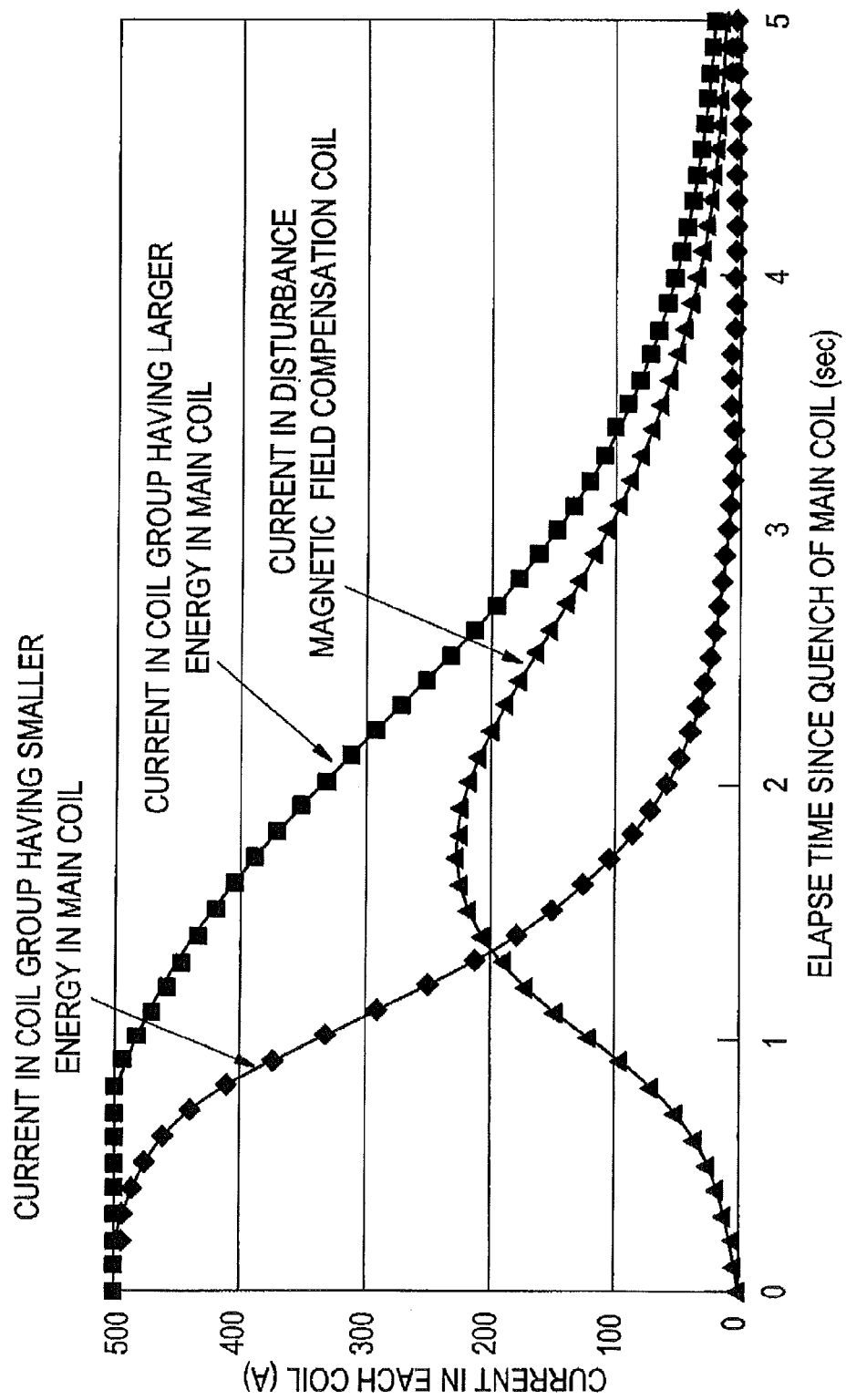
FIG. 6 shows an image of currents in respective coil groups after the quench of a main coil according to the first embodiment of the invention (in the case of two diode circuits)
Figure 7:
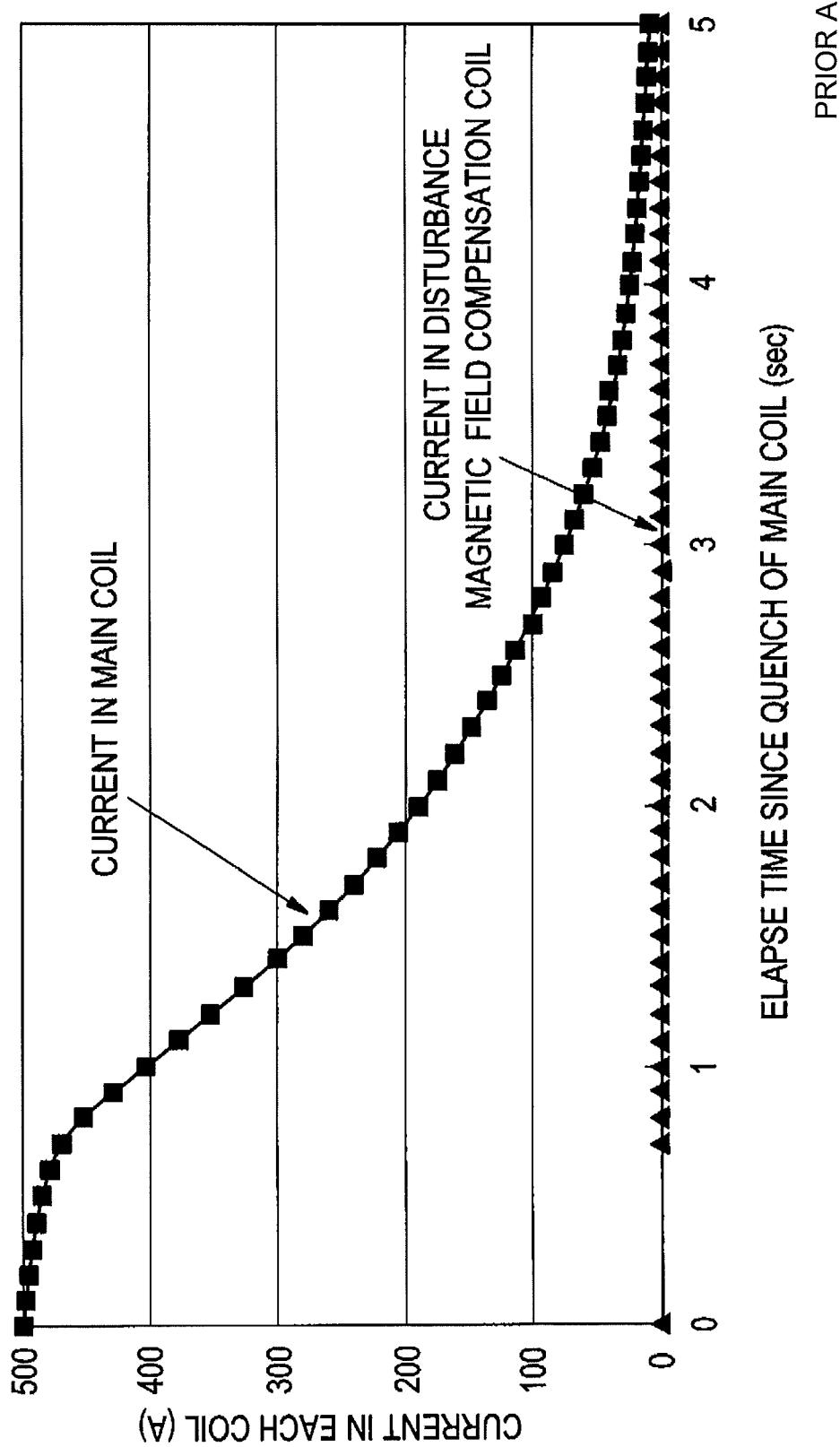
FIG. 7 shows a change in current in the main coil after the quench of the main coil in the related art (in the case of one circuit)
Figure 9:
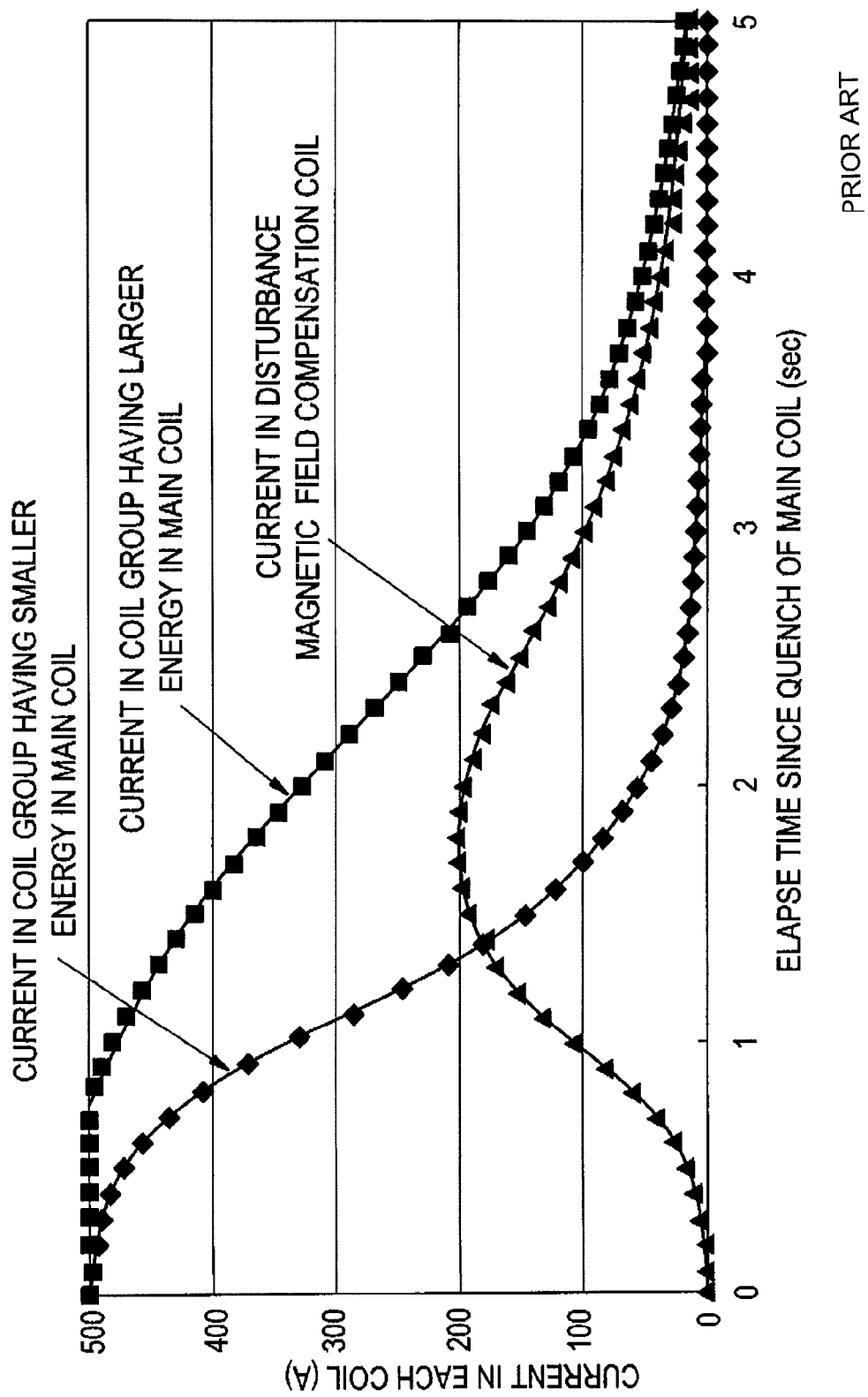
FIG. 9 is a view showing an example of an image of currents in respective coil groups after the quench of the main coil in the related art (in the case of two diode circuits).

Meanwhile, because the disturbance magnetic field compensation coil 300 forms a closed loop, even when the magnetic coupling with the main coil 200 is extremely small in this instance, a current is induced into the disturbance magnetic field compensation coil 300 in association with a difference of currents in the coil groups 210 and 211 when the disturbance magnetic field compensation coil 300 has some extent of magnetic coupling with the coil group 210 or 211. A current transition in each coil after the quench of the main coil in such a case is shown in FIG. 6. As with FIG. 9 in the related art, FIG. 6 shows an example case where the largest electromagnetic force for the disturbance magnetic field compensation coil is generated among various cases of quench.

The electromagnetic force generated in the disturbance magnetic coil compensation coil 300 in this instance is set forth in Table 4 below. Table 4 corresponds to the example in the related art set forth in Table 2 above. A comparison between Table 2 above and Table 4 below reveals that the electromagnetic force in the R direction of the coil No. 6 that is particularly large in the example of the related art (Table 2 above) is reduced to about 70% in the invention (Table 4 below) and there is reduction of about 24.3 tons as the electromagnetic force. A comparison between FIG. 9 and FIG. 6 reveals that although an induced current generated in the disturbance magnetic field compensation coil 300 of the invention shown in FIG. 6 is slightly larger than the induced current generated by the counterpart in the related art, the electromagnetic force is consequently reduced because the number of the turns of the coil No. 6 is smaller than that of the counterpart in the related art.

TABLE 4

Figure 5:
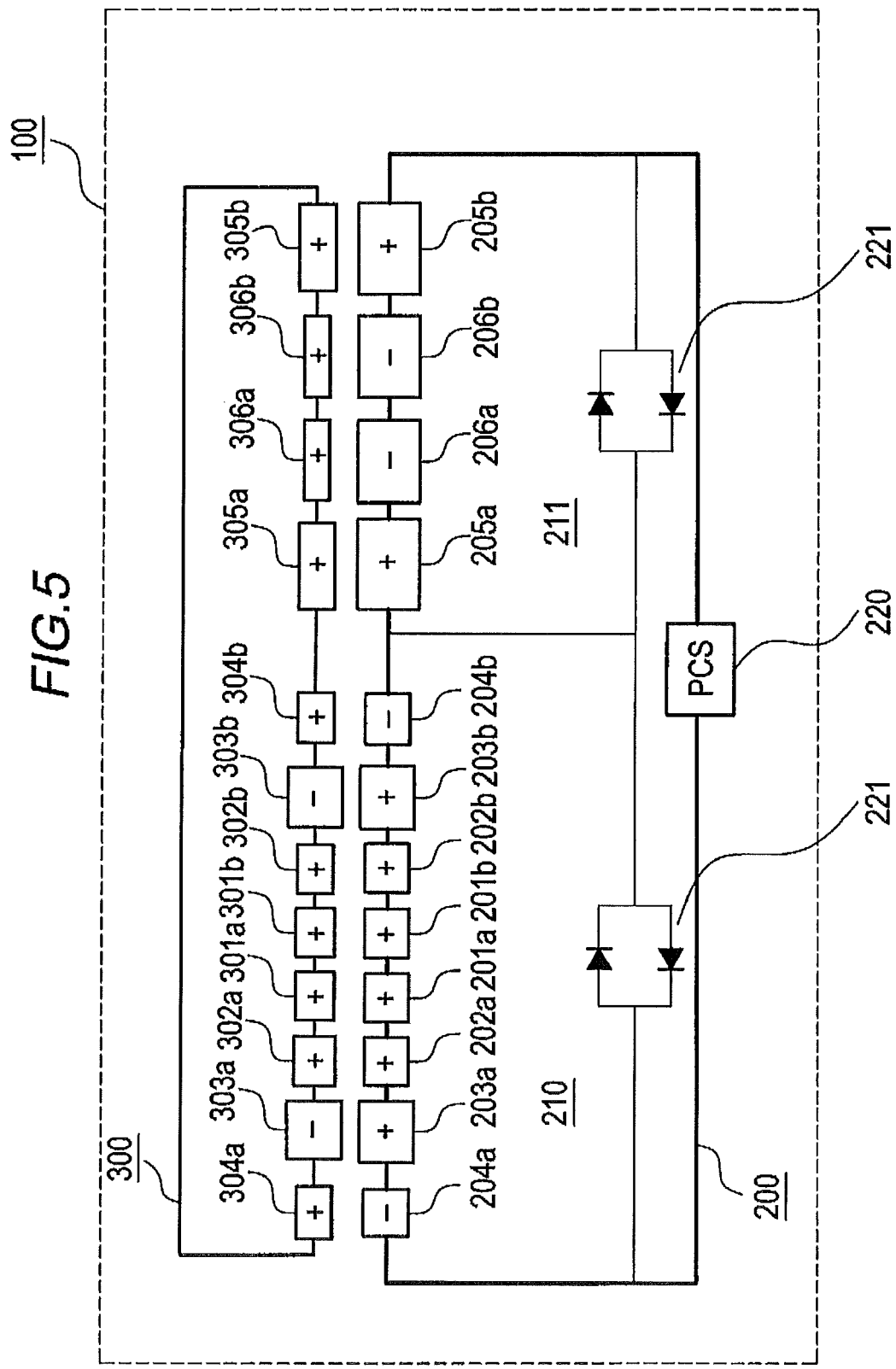
FIG. 5 is a schematic circuit diagram showing the configuration of a superconducting magnet according to a fourth embodiment of the invention.

Maximum electromagnetic force applied to the disturbance magnetic field compensation coil in example of quench of FIG. 5 of the first embodiment of the invention

| (Unit: ton) | No. 1 | No. 2 | No. 3 | No. 4 | No. 5 | No. 6 |
|---|---|---|---|---|---|---|
| Electromagnetic force in Z direction | −0.38 | 0.27 | −2.82 | 6.94 | 0.45 | 3.34 |
| Electromagnetic force in R direction | −0.82 | −4.50 | 8.22 | 4.79 | −26.52 | 55.88 |

Consequently, structural and mechanical measures against the electromagnetic force in the R direction can be readily taken and an inconvenience associated with the electromagnetic force hardly occurs. In some of the other coils, the electromagnetic force is larger in the invention than in the related art. This, however, does not raise a problem particularly, because such an electromagnetic force is so small in comparison with the electromagnetic force in the R direction of the coil No. 6 that it can be readily handled.

In many cases, a space on the top of the coil No. 6 is tight for the reason of installation. It is therefore preferable to reduce the number of turns markedly to about 63% as in the example of the invention also in terms of installation space.

As has been described, by disposing the disturbance magnetic field compensation coils formed of minus turns, such as the coils 303a and 303b shown in FIG. 1, on the main coils formed of plus turns, such as the coils 203a and 203b, respectively, as in the first embodiment, not only is it possible to optimize (minimize) the magnetic coupling between the respective coil groups 210 and 211 and the disturbance magnetic field compensation coil, but it is also possible to reduce the installation space because the disturbance magnetic field compensation coils 306a and 306b to be disposed on the main coils 206a and 206b formed of minus turns in the related art can be readily designed with fewer turns.

Second Embodiment

Figure 3:
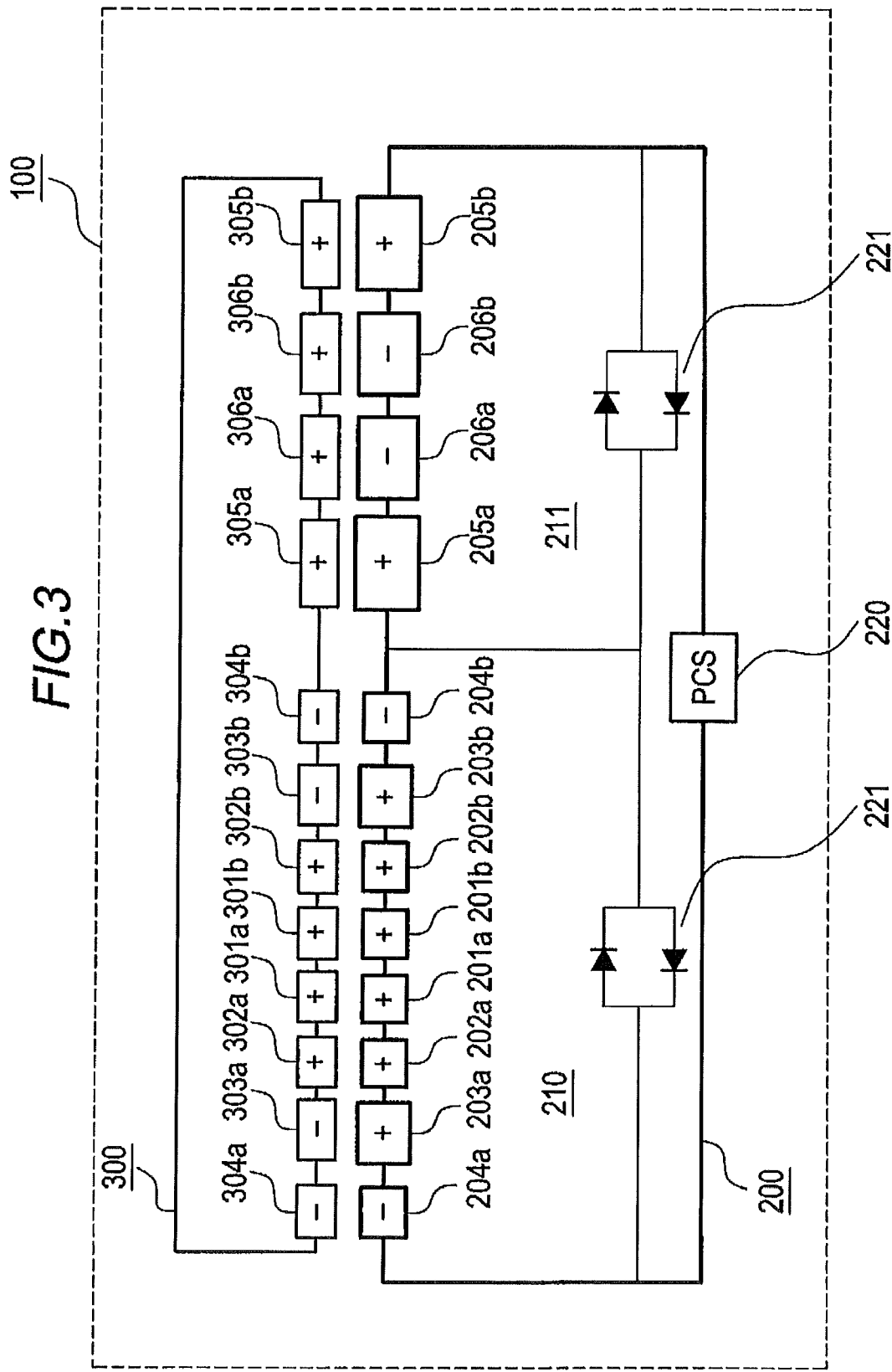
FIG. 3 is a schematic circuit diagram showing the configuration of a superconducting magnet according to a second embodiment of the invention.

A second embodiment of the invention will now be described with reference to FIG. 3.

According to the second embodiment of the invention, not only the disturbance magnetic field compensation coils (303a and 303b) formed of minus turns are disposed on the main coils (203a and 203b) formed of plus turns as in the first embodiment above, but also the disturbance magnetic field compensation coils (304a and 304b) formed of minus turns are disposed on the main coils (204a and 204b) formed of minus turns.

When the magnetic coupling with the main coils is optimized using the disturbance magnetic field compensation coils 303a and 303b alone, there is a possibility that properties of winding wires are deteriorated considerably because the number of turns required for the width of the coils is too large or too small. For example, in a case where the magnetic coupling is reduced exceedingly by the coils 303a and 303b by placing the priority on the properties of winding wires, it is possible to optimize the magnetic coupling through adjustment, for example, by increasing the magnetic coupling with the main coils by further forming the coils 304a and 304b with minus turns and disposing them on the main coils (204a and 204b) formed of minus turns.

Third Embodiment

A third embodiment of the invention will now be described with reference to FIG. 4.

As has been described, because the disturbance magnetic field compensation coil 300 of the invention forms one closed loop, it is necessary to connect the respective coils (301a, 301b, ..., 306a, and 306b) in series. It should be appreciated, however, that a connection work itself takes a reasonable time. It is therefore crucial to reduce the connection points as few as possible in terms of the cost. To this end, it is desirable to wind a plurality of coils continuously without disconnecting the connection to the possible extent. Nevertheless, in a case where the disturbance magnetic field compensation coils formed of the minus turns are present mixedly as in the invention, the connection has to be disconnected and reconnected after the coil is wound.

Figure 4:
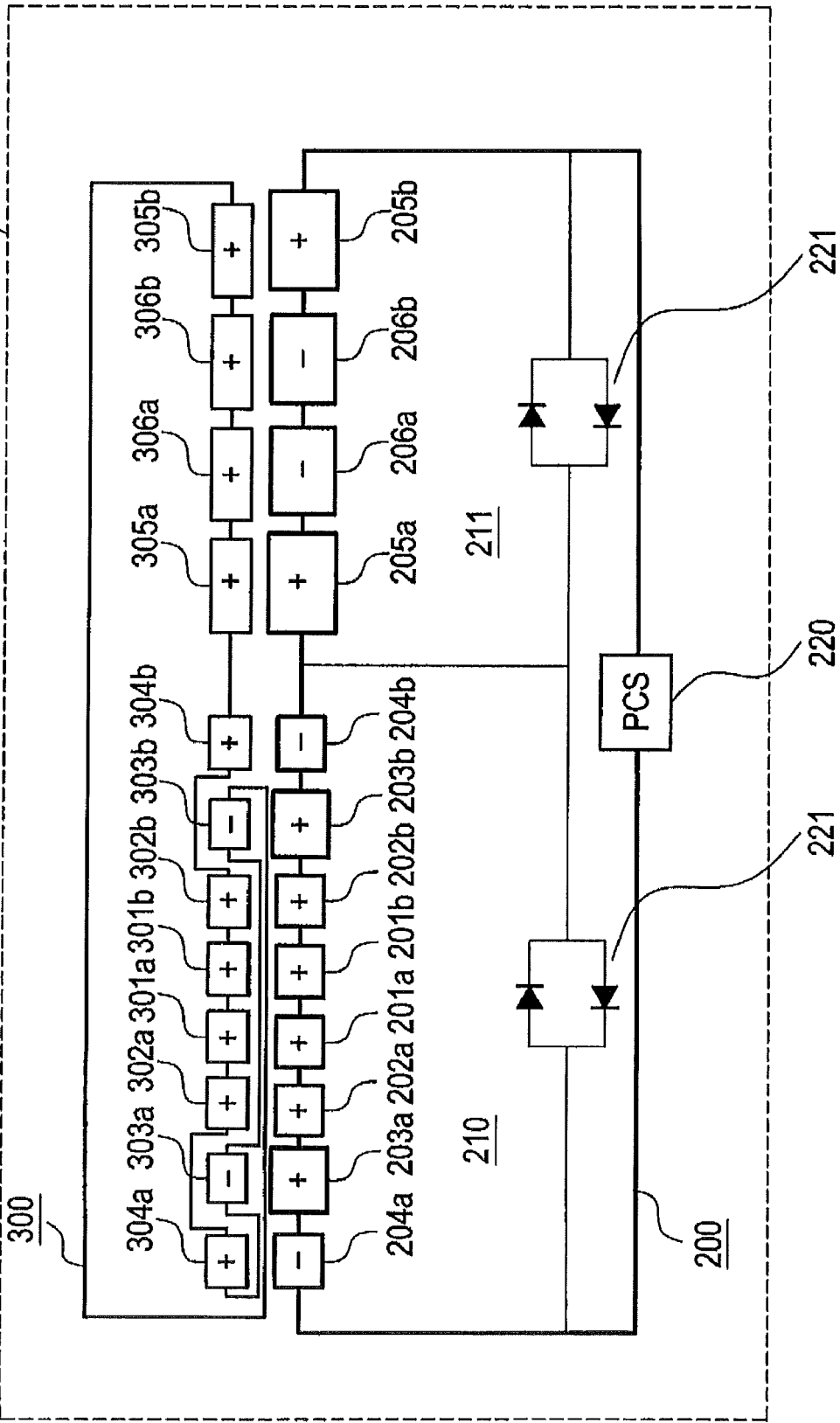
FIG. 4 is a schematic circuit diagram showing the configuration of a superconducting magnet according to a third embodiment of the invention.

Herein, because order of connection of the respective coils is not particularly limited in the disturbance magnetic field compensation coil 300, as is shown in FIG. 4, by putting the coils formed of plus turns together and putting the coils formed of minus turns together and by connecting the former and the latter continuously by winding, only the minimum number of connection points are required. By connecting the coils in the same manner also in the second embodiment above, only the minimum number of connection points are required, too. In this case, the function and the operation of the disturbance magnetic field compensation coils are totally identical with those shown in the first embodiment above (FIG. 1).

Fourth Embodiment

A fourth embodiment of the invention will now be described with reference to FIG. 5.

As has been described, even when it is designed in such a manner that the magnetic coupling between the whole main coil and the disturbance magnetic field compensation coil becomes minimum, a large current is induced into the disturbance magnetic field compensation coil by a difference of currents between the respective diode circuits when the main coil is quenched. It is therefore necessary to reduce also the magnetic coupling between the respective diode circuits in the main coil and the disturbance magnetic field compensation coil, and it has been described that the disturbance magnetic field compensation coil formed of minus turns is useful to this end.

It should be noted, however, that in a case where the main coil is magnetized or demagnetized, no difference of currents is generated between the respective diode circuits. Hence, a current induced into the disturbance magnetic field compensation coil is determined by the magnetic coupling between the whole main coil and the disturbance magnetic field compensation coil. In a case where the magnetic coupling is large, an induced current into the disturbance magnetic field compensation coil is accumulated to the extent that the disturbance magnetic field compensation coil is quenched while the main coil is magnetized or demagnetized. The current attenuates once because of the quench. However, when the disturbance magnetic field compensation coil restores to the superconducting state from attenuation, the induced current is accumulated again. Hence, there is a possibility that the disturbance magnetic field compensation coil is quenched more than once while the main coil is magnetized or demagnetized once. Generally, heat stress is generated frequently when the coil is quenched frequently, which is not preferable for the coil.

In addition, under such a circumstance, part of the magnetization energy of the main coil is absorbed in the disturbance magnetic field compensation coil and the absorbed energy is consumed by the quench as heat energy. This is unfavorable for the energy efficiency. Hence, in some cases, a normal conducting state is preliminarily generated by a heater provided in a part of the disturbance magnetic field compensation coils, so that the induced current will not become exceedingly large while the main coil is magnetized or demagnetized.

However, when the heater is kept energized, a heat quantity is applied to a low-temperature container and a refrigerant is consumed exceedingly. It is therefore preferable to avoid such a case as much as possible.

As has been described, it is desirable to minimize the magnetic coupling between the whole main coil and the disturbance magnetic field compensation coil as in the invention. In this case, however, even when all the disturbance magnetic field compensation coils are formed of plus turns as in the related art (FIG. 8), it is possible to minimize the magnetic coupling because the main coil includes coils formed of minus turns. To achieve this effect, however, it is necessary to dispose the disturbance magnetic field compensation coils (316a and 316b) having relatively many turns on the coils formed of minus turns having relatively large energy, such as the coils 206a and 206b shown in FIG. 8.

Meanwhile, in many cases, there are only tight spaces on the coils formed of minus turns disposed with the purpose to reduce a leaking magnetic field to the outside of the magnet, such as the coils 206a and 206b. It is therefore also necessary to make the necessary number of turns of the disturbance magnetic field compensation coils as small as possible.

In the fourth embodiment, because it is possible to reduce the magnetic coupling with the whole main coil by increasing the number of turns of the coils formed of minus turns, that is, the coils 303a and 303b shown in FIG. 5, than those in the other embodiments, the number of turns of the coils 306a and 306b can be reduced correspondingly.

Various modifications and alterations of this invention will be apparent to those skilled in the art without departing from the scope and spirit of this invention, and it should be understood that this is not limited to the illustrative embodiments set forth herein.

What is claimed is:

1. A superconducting magnet device, comprising:
    a main coil that generates a static magnetic field in an imaging space; and
    a disturbance magnetic field compensation coil that suppresses influences of a variable magnetic field flowing in from outside in the imaging space, wherein:
        the main coil is formed of a closed loop circuit having a plurality of coils divided into at least two diode circuits;
        the disturbance magnetic field compensation coil has at least one coil formed of minus turns; and
        mutual inductance of the main coil and the disturbance magnetic field compensation coil is optimized, so that magnetic coupling between the main coil as a whole and the disturbance magnetic field compensation coil is reduced and so that magnetic coupling between the respective diode circuits in the main coil and the disturbance magnetic field compensation coil is reduced.

2. The superconducting magnet device according to claim 1, wherein:
    at least one coil from the plurality of coils forming the main coil is wound in minus turns; and
    the at least one coil formed of minus turns of the disturbance magnetic field compensation coil is disposed on the main coil formed of plus turns.

3. The superconducting magnet device according to claim 1, wherein:
    the main coil is formed of a closed loop circuit having a plurality of coils each formed of one of plus turns and minus turns;
    and the disturbance magnetic field compensation coil formed of the minus turns is disposed on the main coil formed of the minus turns.

4. The superconducting magnet device according to claim 1, wherein:
    the disturbance magnetic field compensation coil has a first set of coils all formed of turns of a positive polarity and put together in series by one of a method of winding the coils and a method of connecting the coils and a second set of coils all formed of turns of a reversed polarity and put together in series by one of a method of winding the coils and a method of connecting the coils, and is formed by connecting the first set and the second set in series.

5. The superconducting magnet device according to claim 1, wherein at least one coil of the disturbance magnetic field compensation coil has a reduced number of turns with respect to the remaining coils.

* * * * *